United States Patent
Guhathakurta et al.

(10) Patent No.: US 12,048,248 B2
(45) Date of Patent: Jul. 23, 2024

(54) PIEZOELECTRIC POLYMER BLEND AND COMPOSITE COMPOSITIONS INCLUDING LITHIUM-DOPED POTASSIUM SODIUM NIOBATE

(71) Applicant: SABIC Global Technologies B.V., Bergen op Zoom (NL)

(72) Inventors: Soma Guhathakurta, Bangalore (IN); Theodorus Hoeks Lambertus, Bangalore (IN); Ramanarayanan Ganapathy Bhotla Venkata, Bangalore (IN); Donald Owens, Bangalore (IN)

(73) Assignee: SABIC GLOBAL TECHNOLOGIES, B.V., Bergen op Zoom (NL)

( * ) Notice: Subject to any disclaimer, the term of this patent is extended or adjusted under 35 U.S.C. 154(b) by 0 days.

(21) Appl. No.: 17/916,248

(22) PCT Filed: Apr. 1, 2021

(86) PCT No.: PCT/EP2021/058678
§ 371 (c)(1),
(2) Date: Sep. 30, 2022

(87) PCT Pub. No.: WO2021/198452
PCT Pub. Date: Oct. 7, 2021

(65) Prior Publication Data
US 2023/0127574 A1    Apr. 27, 2023

(30) Foreign Application Priority Data
Apr. 2, 2020   (IN) ............... 202041014650

(51) Int. Cl.
| | |
|---|---|
| H10N 30/85 | (2023.01) |
| C08J 3/00 | (2006.01) |
| C08J 3/21 | (2006.01) |
| C08J 5/18 | (2006.01) |
| C08K 3/22 | (2006.01) |
| C08L 27/16 | (2006.01) |
| H10N 30/045 | (2023.01) |
| H10N 30/092 | (2023.01) |
| H10N 30/30 | (2023.01) |

(52) U.S. Cl.
CPC ............ *H10N 30/852* (2023.02); *C08J 3/005* (2013.01); *C08J 3/212* (2013.01); *C08J 5/18* (2013.01); *C08K 3/22* (2013.01); *C08L 27/16* (2013.01); *H10N 30/045* (2023.02); *H10N 30/092* (2023.02); *H10N 30/302* (2023.02); *C08J 2327/16* (2013.01); *C08J 2433/12* (2013.01); *C08J 2433/20* (2013.01); *C08J 2471/12* (2013.01); *C08K 2003/2203* (2013.01); *C08K 2201/001* (2013.01); *C08L 2203/16* (2013.01); *C08L 2203/20* (2013.01)

(58) Field of Classification Search
None
See application file for complete search history.

(56) References Cited

U.S. PATENT DOCUMENTS

| | | | |
|---|---|---|---|
| 5,951,908 | A | 9/1999 | Cui et al. |
| 7,842,390 | B2 | 11/2010 | Chung et al. |
| 9,752,941 | B2 | 9/2017 | Jeon et al. |
| 2010/0067172 | A1 | 3/2010 | Zhang et al. |
| 2011/0074249 | A1* | 3/2011 | Sakashita ............... C08K 3/22 |
| | | | 252/62.9 R |
| 2014/0001453 | A1* | 1/2014 | Cho ..................... H10K 10/471 |
| | | | 524/173 |
| 2015/0027132 | A1 | 1/2015 | Zhang et al. |
| 2015/0134061 | A1 | 5/2015 | Friis et al. |
| 2016/0076798 | A1 | 3/2016 | Zhang et al. |
| 2017/0018700 | A1 | 1/2017 | Miyoshi et al. |
| 2017/0114241 | A1 | 4/2017 | Almadhoun et al. |

(Continued)

FOREIGN PATENT DOCUMENTS

| | | |
|---|---|---|
| CN | 105254298 B | 12/2017 |
| WO | 2016157092 A1 | 10/2016 |
| WO | 2018085936 A1 | 5/2018 |

(Continued)

OTHER PUBLICATIONS

Foreign Communication from Related Application—International Search Report and Written Opinion of the International Searching Authority, International Application No. PCT/EP2021/058678, dated Jul. 8, 2021, 8 pages.

Xiang-Dong Chen et al.,"0-3 Piezoelectric composite film with high d33 coefficient",Sensors and Actuators, 1998, 194-196, A 65, Department of Materials Science and Engineering, University of Electronic Science and Technology, Chengdu, 610054, China.

(Continued)

*Primary Examiner* — Robert T Butcher
(74) *Attorney, Agent, or Firm* — Rodney B. Carroll; Conley Rose, P.C.

(57) ABSTRACT

A polymer composite exhibiting piezoelectric properties can be formed for flexible and/or thin film applications, in which the polymer composite includes a polymer matrix and a piezoelectric ceramic filler embedded in the polymer matrix. The polymer matrix may include at least two polymers: a first polymer and a second polymer. The first polymer may be a fluorinated polymer, and the second polymer may be compatible with the first polymer and have a dielectric constant of less than approximately 20. The piezoelectric ceramic filler can be lithium doped potassium sodium niobite (KNLN), and be approximately 40-70% by volume of the polymer composite. The remaining 30-60% by volume may be the polymer matrix, which may itself be approximately 5-20% by weight second polymer and 80-95% fluorinated polymer.

18 Claims, 4 Drawing Sheets

(56) References Cited

U.S. PATENT DOCUMENTS

| | | |
|---|---|---|
| 2018/0083183 A1 | 3/2018 | Bella et al. |
| 2019/0181330 A1* | 6/2019 | Tanabe ................. C01G 33/006 |

FOREIGN PATENT DOCUMENTS

| | | |
|---|---|---|
| WO | 20190180586 A1 | 9/2019 |
| WO | 20210198452 A1 | 10/2021 |

OTHER PUBLICATIONS

Sara Dalle Vacche et al., "The effect of processing conditions on the morphology, thermomechanical, dielectric and piezoelectric properties of PVDF-TrFE/BaTiO3 composites ",Journal of Materials Science, 2012, 4763-4774,47, Springer Science+Business Media, LLC (Published online).

Marco Di Donato, "Development of composite piezoelectric materials for tactile sensing", Politecnico di Torino, Jan. 2012-Dec. 2014, Dipartimento di Scienza Applicata e Tecnologia PhD Thesis in Physics XXVII cycle.

Daniella B. Deutz et al., "Flexible Piezoelectric Touch Sensor by Alignment of Lead-Free Alkaline Niobate Microcubes n PDMS", Advanced functional materials, Adv. Funct. Mater., 2017, 1-7, 1700728, WILEY-VCH Verlag GmbH & Co. KGaA, Weinheim.

Baojin Chu , Yang Zhou, "Energy storage properties of PVDF terpolymer/PMMA blends" Dielectric Polymer Materials for High-Energy-Density Storage, 2016, vol. 1, Iss. 4, 171-174, The Institution of Engineering and Technology (IET Journals).

Amir Ullah et al., "Enhancement of Dielectric and Energy Density Properties in the PVDF-Based Copolymer/Terpolymer Blends", Polymer Engineering and Science, 2015, pp. 1-7, Published online in Wiley Online Library (wileyonlinelibrary.com).

S. G. Lu et.al., "Large Displacement in Relaxor Ferroelectric Terpolymer Blend Derived Actuators Using Al Electrode for Braille Displays", Scientific Reports, Jun. 16, 2015, 5:11361, 1-7, Published online in www.nature.com/scientificreports/.

Baojin Chu, "PVDF-Based Copolymers, Terpolymers and Their Multi-Component Material Systems for Capacitor Applications", A Dissertation in Materials Science and Engineering, May 2008,pp. 1-184, Submitted in Partial Fulfillment of the Requirements for the Degree of Doctor of Philosophy, The Pennsylvania State University.

Foreign communication from related application—International Preliminary Report on Patentability dated Sep. 29, 2022 for International Application No. PCT/EP2021/058678 filed Apr. 1, 2021, 5 pages.

* cited by examiner

PIEZOELECTRIC POLYMER BLEND AND COMPOSITE COMPOSITIONS INCLUDING LITHIUM-DOPED POTASSIUM SODIUM NIOBATE

CROSS REFERENCE TO RELATED APPLICATIONS

This application is a filing under 35 U.S.C. 371 of International Application No. PCT/EP2021/058678 filed Apr. 1, 2021, entitled "Piezoelectric Polymer Blend and Composite Compositions Including Lithium-Doped Potassium Sodium Niobate," which claims priority to Indian Patent Application No. 202041014650 filed Apr. 2, 2020, which applications are incorporated by reference herein in their entirety.

FIELD OF INVENTION

The present invention generally relates to piezoelectric materials. More specifically, the present invention relates to polymeric materials with piezoelectric characteristics.

BACKGROUND OF THE INVENTION

Piezoelectric materials are materials that have a defined relationship between electric charge accumulated in the material and mechanical stress applied to the material. Some conventional piezoelectric materials are inorganic ceramic materials (e.g., piezoelectric ceramic materials) which are heavy and brittle. These inorganic ceramic materials require high temperature processing exceeding 500° C. Other conventional piezoelectric materials are piezoelectric polymers, such as PVDF and PVDF-TrFE copolymers. These piezoelectric polymers have a low piezoelectric charge/strain constant, d, compared to the piezoelectric ceramics. Piezoelectric charge/strain constant, d, is an important parameter to assess the actuation ability of a piezoelectric material when subjected to an electric field and piezoelectric voltage constant, g, is used to measure the sensing capability of a piezoelectric material. Inorganic piezoelectric ceramics exhibit high d ($d_{33}$>150 pC/N), but the high value of dielectric constant limits their g value ($g_{33}$<50 mV·m/N). In contrast piezoelectric polymers show a lower d ($d_{33}$≈13-28 pC/N) and a higher g ($g_{33}$≈200 mV-m/N). The $d_{33}$ value refers to induced polarization in direction 3 (parallel to the direction in which the ceramic element is polarized) per unit stress applied in direction 3. The $g_{33}$ value refers to induced electric field in direction 3 (parallel to the direction in which the ceramic element is polarized) per unit stress applied in direction 3. Materials exhibiting higher $d_{33}$ and $g_{33}$ values are desired. For a material to be considered as piezoelectric the $d_{33}$ value is greater than approximately 1 pC/N.

BRIEF SUMMARY OF THE INVENTION

High performing piezoelectric materials are desirable for sensors, actuators, and energy harvesters in healthcare and biomedical applications and wearable, electronics. For these and other applications, mechanically-flexible piezoelectric materials are desired. Embodiments of the invention provide piezoelectric composite films made using lead-free piezoelectric ceramic filler. Piezoelectric polymer composites provide one or more of a high piezoelectric property with mechanical flexibility, thin film forming ability, both freestanding film and supported film on a substrate, simple process of making the piezoelectric polymer composite, and/or low-temperature processing.

An example polymer composite includes a polymer matrix of at least two polymers, with a piezoelectric ceramic filler embedded in the polymer matrix. The polymer matrix may include a fluorinated polymer and a second polymer having a dielectric constant of less than approximately 20. The second polymer characteristics affects the dielectric constant of the matrix and influences the dispersion of filler in the matrix, which in turn can affect the dielectric constant of the piezoelectric polymer composite. In addition to the dielectric constant being less than twenty, the second polymer is compatible with the first polymer. Compatibility of polymers may be determined based on a shift in the transition temperature ($T_m$ or $T_g$) of polymers in the blend compared to that in the neat polymer. A polymer may be compatible when the shift is greater than 2° C. Example polymer materials for use as the second polymer in the polymer matrix that are compatible with PVDF-TrFE-CFE (when PVDF-TrFE-CFE is the fluorinated polymer) include PVDF-TrFE (which has a dielectric constant of between approximately 8-10), PC (which has a dielectric constant of between approximately 3), and PPO (which has a dielectric constant of approximately 2.5), each of which have a dielectric constant of less than 20. In some embodiments, piezoelectric ceramic filler loading in the polymer matrix may be between approximately 40-70% by volume. Piezoelectric ceramic filler loading outside of this range for PVDF-TrFE-CFE-based polymer matrices is mechanically brittle. In some embodiments, second polymer loading in the polymer matrix may be between 5-20% by weight. Second polymer loading outside of this weight range for PVDF-TrFE-CFE-based polymer matrices showed a drop in piezoelectric properties.

Manufacturing of piezoelectric polymer composites according to aspects of the disclosed invention may include dissolving the two polymers of the polymer matrix in a solvent to form a two-polymer solution, adding the piezoelectric ceramic filler to the two-polymer solution to form a suspension, and forming the polymer composite as a thin film by casting onto the substrate and drying the solvent. During processing, the piezoelectric polymer composite may be subjected to electric polarization. In some embodiments, the composite film is annealed and/or the composite film is subjected to a corona poling process. Additionally, in some embodiments, melt processing techniques may be used for making piezocomposite film; the piezocomposite film may be ordered as a (0-3) (random), (1-3) (structured) piezocomposite; and/or other ex-situ and in-situ techniques may be used for making the piezocomposites. (0-3) piezoelectric polymer composite refers to the connectivity of the ceramic and polymer components. The first digit corresponds to the connectivity in ceramic components, and the second digit corresponds to the connectivity in polymer. Composites in which the piezoelectric ceramic particles are surrounded by a three dimensionally connected polymer phase have (0-3) connectivity. Some (1-3) piezocomposite materials may exhibit higher $d_{33}$ values compared to (0-3) piezocomposite.

Polymer composites according to aspects of the disclosed invention may be deposited on substrates as thin film and formed into piezoelectric devices. In some embodiments, the polymer composite is a mechanically-flexible thin film formed on a flexible substrate as part of the manufacture of flexible electronic devices. An elongation-at-break value (in percent) may be used to demonstrate mechanical flexibility of materials. In some embodiments, the elongation-at-break (in percent) of the piezoelectric composite film is greater than 25%. Such electronic devices may include a piezoelectric sensor configured to generate an analog signal proportional to an, amount of deflection applied to the piezoelectric sensor by a user. The piezoelectric sensor could be integrated in a mobile device for receiving user input for controlling the mobile device. In one example of a wearable medical device, the mechanical vibrations of body organs, such as a heartbeat, can be converted into electrical signals and transmitted via Bluetooth, Wi-Fi, or other signal to a smartphone or other computing device. In another example use of a piezoelectric material, the material may be used as a transducer to convert signals for output, such as by configuring the piezoelectric as a speaker or buzzer to convert signals to audible sounds. In yet another example use of a piezoelectric material, the material may be transparent and incorporated into an electronic display to create a touch-screen device that can display information to a user and receive user feedback on the displayed information through taps on the screen.

One example piezoelectric material according to some embodiments of the disclosure include a three-component piezoelectric composite material comprising polymer1/polymer2/piezoelectric filler, in which polymer1 is PVDF-TrFE-CFE, in which polymer2 is a low-dielectric polymer (having a dielectric constant <20) that is compatible with PVDF-TrFE-CFE, and in which the piezoelectric filler is lithium doped potassium sodium niobate (KNLN). This example material, and other materials according to the invention, may be made using a solvent with dielectric constant >20 and boiling point ≥80° C., in which the use of the solvent may provide the combination of high $d_{33}$ and $g_{33}$ of the piezocomposite films. A high boiling point and high dielectric solvent may help in filler dispersion within the matrix to improve piezoelectric characteristics of the film. In the composite, the piezoelectric filler loading may be greater than 40% by volume. $d_{33}$ and $g_{33}$ values for formed piezocomposite films may be $d_{33} \approx 30\text{-}70$ pC/N and $g_{33} \approx 100\text{-}300$ mV-m/N.

Another example material according to some embodiments of the disclosure is a polymer blend with piezoelectric properties having at least two polymers: a first polymer comprising a non-piezoelectric fluorinated polymer; and a second polymer comprising non-piezoelectric acrylic polymer. The polymer blend may contain approximately 5-15 percent by weight of the second polymer.

Piezocomposite materials according to embodiments of the invention, and devices incorporating those piezocomposite materials, may provide a cost benefit over commercial piezoelectric polymers. Further, lead-free piezocomposites are solution processible and cheaper in comparison with commercial piezoelectric polymers. Additionally, a self-standing piezoelectric polymer film of larger dimension can be made by manufacturing processes described herein. Further, piezocomposite films described herein can be made mechanically flexible, because the process is capable of forming a piezoelectric layer of desired thickness at a low temperature of about 110 degrees Celsius, or not exceeding 150 degrees Celsius. Piezoelectric composites can be deposited onto a substrate in some disclosed manufacturing techniques and poled more efficiently than contact poling. In some embodiments, depending on the application requirement, the desired metal electrode patterning can be carried out on top of the active layer after poling.

Example materials for the piezoelectric filler include any lead-free ceramic or single crystal material. Non-limiting examples of piezoelectric materials include inorganic compounds of the perovskite family. Non-limiting examples of piezoelectric ceramics with the perovskite structure include barium titanate ($BaTiO_3$), hydroxyapatite, apatite, lithium sulfate monohydrate, sodium potassium niobate, sodium bismuth titanate, quartz, organic materials (for example, tartaric acid, poly(vinylidene difluoride) fibers), or combinations thereof. In a preferred embodiment, the piezoelectric additive is $BaTiO_3$. The lead-free piezoelectric particles can have a particle size of 200 nm to 1000 nm, or 250 nm to 350 nm, or at least, equal to, or between any two of 200 nm, 225 nm, 250 nm, 275 nm, 300 nm, 325 nm, 350 nm, 375 nm, 400 nm, 425 nm, 450 nm, 475 nm, 500 nm, 525 nm, 550 nm, 575 nm, 600 nm, 625 nm, 650 nm 675 nm, 700 nm, 725 nm, 750 nm, 775 nm, 800 nm 825 nm, 850 nm, 875 nm, 900 nm, 925 nm, 950 nm 975 nm, and 1000 nm.

Example materials for the polymers include a thermoset polymer, copolymer and/or monomer, a thermoplastic polymer, copolymer and/or monomer or a thermoset/thermoplastic polymer or copolymer blend. Thermoset polymers are malleable prior to heating and capable of forming a mold. The matrix can be made from a composition having a thermoplastic polymer and can also include other non-thermoplastic polymers, additives, and the like, that can be added to the composition. Thermoset polymeric matrices are cured or become cross-linked and tend to lose the ability to become pliable or moldable at raised temperatures. Non-limiting examples of thermoset polymers used to make the polymer film include epoxy resins, epoxy vinylesters, alkyds, amino-based polymers (e.g., polyurethanes, urea-formaldehyde), diallyl phthalate, phenolics polymers, polyesters, unsaturated polyester resins, dicyclopentadiene, polyimides, silicon polymers, cyanate esters of polycyanurates, thermosetting polyacrylic resins, bakelite Duroplast, benzoxazines, or co-polymers thereof, or blends thereof.

Thermoplastic polymeric matrices have the ability to become pliable or moldable above a specific temperature and solidify below the temperature. The polymeric matrix of the composites can include thermoplastic or thermoset polymers, co-polymers thereof, and blends thereof that are discussed throughout the present application. Non-limiting examples of thermoplastic polymers include polyvinylidene fluoride (PVDF), PVDF-based polymer, PVDF copolymer (Polyvinylidene fluoride-trifluoroethylene (PVDF-TrFE)), PVDF terpolymer (poly(vinylidene fluoride-trifluoroethylene-chlorofluoroethylene) (PVDF-TrFE-CFE), poly(vinylidene fluoride-trifluoroethylene-chlorotrifluoroethylene) (PVDF-TrFE-CTFE), odd-numbered nylon, cyano-polymer, polyethylene terephthalate (PET), a polycarbonate (PC) family of polymers, polybutylene terephthalate (PBT), poly (1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly (cyclohexanedimethylene terephthalate) (PCT), polyethylene naphthalate (PEN), polyamide (PA), polysulfone sulfonate (PSS), sulfonates of polysulfones, polyether ether ketone (PEEK), polyether ketone (PEKK), acrylonitrile butylidene styrene (ABS), acrylonitrile-styrene-acrylate (ASA) polymer, polyphenylene sulfide (PPS), co-polymers thereof, or blends thereof. In addition to these, other thermoplastic polymers known to those of skill in the art, and those hereinafter developed, can also be used in the context of the present invention. The thermoplastic polymer can be included in a composition that includes said polymer and additives. Non-limiting examples of additives include coupling agents, antioxidants, heat stabilizers, flow modifiers, colorants, etc., or any combinations thereof. In a preferred instance, a polyvinylidene difluoride (PVDF) polymer, a copolymer thereof or a terpolymer thereof is used. The terpolymer can be poly(vinylidene fluoride-trifluoroethylene-chlorofluoroethylene) (PVDF-TrFE-CFE).

Example solvents for use in the production of the lead-free piezoelectric composite can be any solvent having dielectric constant ≥20 and boiling point ≥80° C. Non-limiting examples of solvents include dimethyl acetamide (DMAc), dimethyl formamide (DMF), dimethylsulfoxide (DMSO), N-methyl-2-pyrrolidone (NMP), or combinations thereof. In some embodiments, the solvent is DMAc. The dielectric constant of the solvent can be at least, equal to, or greater than 20, 25, 30, 35, 40, 45, 50, 55, 60, 65, 70, 75, 80. The boiling point of the solvent can be at least, equal to, or greater than 80° C., 85° C., 90° C., 95° C., 100° C., 105° C., 110° C., 115° C., 120° C., 125° C., 130° C., 135° C., 140° C., 145° C., 150° C., 155° C., 160° C., 165° C., 170° C., 180° C., 185° C., 190° C., 195° C., 200° C., or 210° C. Various combinations of dielectric constant and boiling point can be used as long as both criteria are met.

Some polymer composites may exhibit piezoelectric properties without a piezoelectric filler. One example of such a material is a polymer blend having at least two polymers, including a first polymer comprising a non-piezoelectric fluorinated polymer and a second polymer comprising a non-piezoelectric acrylic polymer. The polymer blend may contain approximately 5-15 percent by weight, and preferably 8-12 percent, by weight of the second polymer, and the polymer blend exhibits piezoelectric properties. The acrylic polymer induces crystallization at these compositions, which creates an improvement in mechanical property and establishes a piezoelectric property.

The terms "wt. %", "vol. %" or "mol. %" refers to a weight, volume, or molar percentage of a component, respectively, based on the total weight, the total volume, or the total moles of material that includes the component. In a non-limiting example, 10 moles of component in 100 moles of the material is 10 mol % of component.

The term "substantially" and its variations are defined to include ranges within 10%, within 5%, within 1%, or within 0.5%.

The terms "inhibiting" or "reducing" or "preventing" or "avoiding" or any variation of these terms, when used in the claims and/or the specification, includes any measurable decrease or complete inhibition to achieve a desired result.

The term "effective," as that term is used in the specification and/or claims, means adequate to accomplish a desired, expected, or intended result.

The use of the words "a" or "an" when used in conjunction with the term "comprising," "including," "containing," or "having" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The process of the present invention can "comprise," "consist essentially of," or "consist of" particular ingredients, components, compositions, etc., disclosed throughout the specification.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

For a more complete understanding, reference is now made to the following descriptions taken in conjunction with the accompanying drawings, in which.

DETAILED DESCRIPTION OF THE INVENTION

Figure 1:
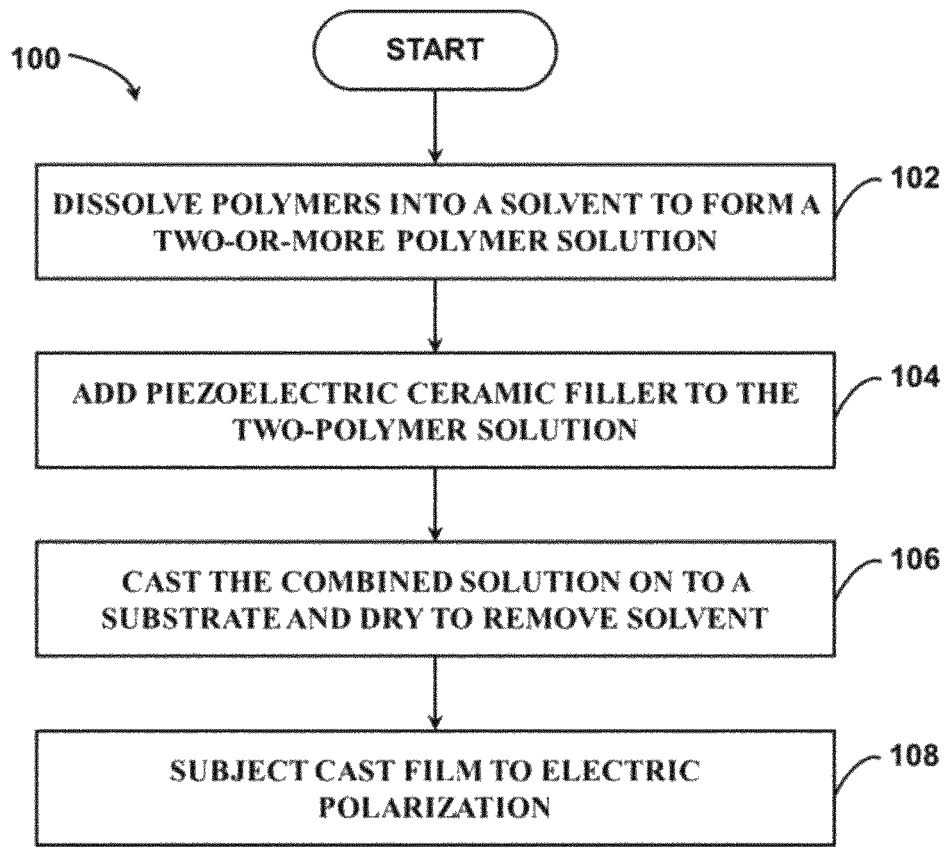
FIG. 1 shows a method of manufacturing a piezoelectric polymer composite according to some embodiments of the disclosure.

A method of manufacturing a piezoelectric polymer composite is shown in FIG. 1. The method 100 begins at block 102 with dissolving the two polymers in a solvent to form a two-polymer solution, which may form a two-polymer solution having a concentration of polymer to solvent of at least approximately 12%, such as Rained by means 12 g PVDF-TrFE-CFE resin dissolved in 100 mL solvent. The polymer concentration in the solution used for making piezocomposites may be 5-20% (wt/v), or more preferably 8-15%, or more preferably 10-13% (wt/v). A composite with less than 5% (wt/v) may result in a non-continuous film. Concentrations above 20% (wt/v) may result in difficulty creating high filler loading. In some embodiments, less than 5% (wt/v) may be possible with different manufacturing techniques to still obtain desirable piezoelectric and other properties. Then, at block 104, the method 100 continues with optionally adding piezoelectric ceramic filler to the two-polymer solution to form a dispersion. In some embodiments, such as a polymer blend manufactured as a piezoelectric material, no piezoelectric ceramic filler is added. At block 106, the polymer composite thin film may be formed by casting on a substrate and drying the solvent. At block 108, the cast piezocomposite film is subjected to an electric polarization. The method 100 may be performed without exceeding a temperature of about 120 degrees C., such that the manufacturing process can be used for the manufacturing of the piezoelectric composites on flexible substrates. The temperature may be selected as approximately the Curie temperature of the barium titanate piezoelectric ceramic filler and approximately the melting temperature of the PVDF-TrFE-CFE polymer matrix. In some embodiments, after casting the film on the substrate, the piezoelectric composite is annealed in an inert atmosphere (such as nitrogen gas). Although embodiments of the present invention, have been described with reference to blocks of FIG. 1, it should be appreciated that operation of the present invention is not limited to the particular blocks and/or the particular order of the blocks illustrated in FIG. 1. Accordingly, embodiments of the invention may provide functionality as described herein using various blocks in a sequence different than that of FIG. 1.

In some embodiments, the piezoelectric composite can have any shape or form. In some embodiments, the piezoelectric composite is a film or sheet. In some embodiments, the film or sheet has a thickness dimension of 50 to 200 microns, or at least, equal to, or between any two of 50, 60, 70, 80, 90, 100, 110, 120, 130, 140, 150, 160, 170, 180, 190, and 200 microns.

include at least two polymers: a first polymer and a second polymer. The first polymer may be a fluorinated polymer, and the second polymer may be compatible with the first polymer and have a dielectric constant of less than approximately 20. The piezoelectric ceramic filler can be lithium doped potassium sodium niobate (KNLN), and be approximately 40-70% by volume of the polymer composite. The remaining 30-60% by volume may be the polymer matrix, which may itself be approximately 2-10% by weight second polymer and 90-98% fluorinated polymer. The resulting piezoelectric properties of the piezoelectric composite may be a piezoelectric strain constant of between approximately 30 and approximately 70 pC/N; and a piezoelectric voltage constant between approximately 100 and approximately 300 mV-m/N. Example embodiments using KNLN ceramic filler, PVDF-TrFE-CFE as polymer 1, DMAc as solvent, and 40 volume percent KNLN loading are shown in Table 1. Also shown in some examples Table 1 are polymer blends with no KNLN particles.

TABLE 1

Piezoelectric composite and blend compositions (e.g., films or coatings) using PVDF-TrFE-CFE as the first polymer in the polymer matrix, some loaded with KNLN piezoelectric filler.

| Example no. | Polymer 2 | Polymer 2 weight (%) | KNLN loading (vol %) | Melting temp(s) (° C.) | ΔH (J/g) | $d_{33}$ (pC/N) | Young's modulus (Mpa) | Strain at break (%) |
|---|---|---|---|---|---|---|---|---|
| 1 | ASA | 10 | 40 | | | 23.5 | 36 | 74 |
| 2 | PMMA | 10 | 40 | | | 29 | 79 | 2 |
| 3 | PPO | 10 | 40 | | | 33.6 | 32 | 135 |
| 4 | ASA | 5 | — | 128 | 14 | <1 | | |
| 5 | ASA | 10 | — | 106, 156 | 17, 25 | 14.3 | 62 | 128 |
| 6 | ASA | 20 | — | 128 | 12 | <1 | | |
| 7 | PMMA | 10 | — | 118, 150 | 1.97, 10.7 | 6.9 | 202 | 98 |
| 8 | PPO | 10 | — | 121 | 12 | <1 | | |

Properties of the piezoelectric composite include electrical and mechanical properties. Non-limiting examples of electrical properties can include piezoelectric constant, dielectric constant, and the like. The $d_{33}$ of the piezoelectric composite be at least, equal to, or between 40 pC/N, 45 pC/N, 50 pC/N, 55 pC/N, 56 pC/N, 57 pC/N, 58 pC/N, 59 pC/N, 60 pC/N, 61 pC/N, 62 pC/N, 63 pC/N, 64 pC/N, 65 pC/N, 66 pC/N, 67 pC/N, 68 pC/N, 69 pC/N, and 70 pC/N. By way of example, the piezoelectric composite can have a dielectric constant that is less than, equal to, or between any two of 120, 115, 110, 105, 100, 95, 90, 85, 80, 75, 70, 65, 60, 55, 50, 45, 40, and 35. In some embodiments, the dielectric constant is from 90 to 210. The lead-free piezoelectric composite can have a storage modulus can range from 100 to 325 MPa, or at least, equal to, or between any two of 100, 125, 150, 175, 200, 225, 250, 275, 300, and 325 MPa. Storage modulus can be measured according to ISO 6721 at room temperature and a 1 Hz strain of 0.2%. The lead-free piezoelectric composite can have an elongation break of 30 to 500% under uniaxial loading at room temperature (e.g., 25 to 35° C.). Elongation break can be measured using standard dynamic mechanical analyzer.

A polymer composite exhibiting piezoelectric properties may be formed for film, sheet, or coating film applications, in which the polymer composite includes a polymer matrix and a piezoelectric ceramic filler embedded in the polymer matrix. Although film examples are described in certain embodiments, the materials described may be used or adapted for sheets or coatings. The polymer matrix may Examples 1-3 were prepared by dissolving Polymer 2 in DMAc. PVDF-TrFE-CFE was then added and stirred until it dissolved completely. The concentration of the solution was ~12% (w/v). Subsequently, the desired amount of KNLN was added slowly to the solution, under stirring at 200-250 rpm using a magnetic stirrer. After stirring for 30 min, the mixture was casted into a thin film using doctor blade on to a glass plate, followed by drying in open air for 24 h. After drying, the films were peeled from the glass plate and annealed in a nitrogen environment. The compositions of the piezoelectric polymer composites prepared following the procedure mentioned above are provided in Table 1.

Examples 4-8 were prepared by dissolving Polymer 2 in DMAc. PVDF-TrFE-CFE was then added and stirred until it dissolved completely. The concentration of the solution was ~12% (w/v). The solution was casted into a thin film using doctor blade onto a glass plate, followed by drying in open air for 24 h. After drying, the films were peeled from the glass plate and annealed in a nitrogen environment. The compositions of the piezoelectric polymer blends prepared following the procedure mentioned above are provided in Table 1.

The piezoelectric characteristics vary between the examples of Table 1. Comparison of Examples 5, 6, 7 and 8 shows that Example 5 and 7 demonstrate piezoelectricity upon poling, with the $d_{33}$ of Example 5 being higher than that of Example 7.

Figure 2:
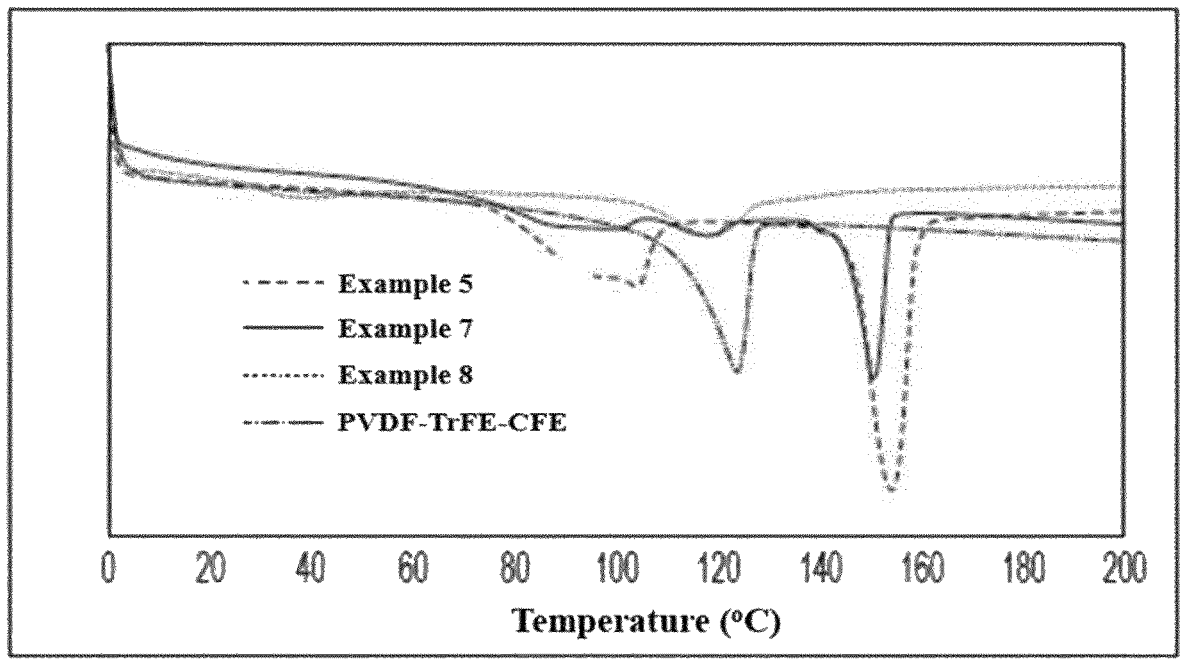
FIG. 2 shows DSC thermograms of piezoelectric polymer blends with a 90:10 weight ratio of PVDF-TrFE-CFE: Polymer 2 according to some embodiments of the disclosure.

FIG. 2 shows DSC thermograms of piezoelectric polymer blends with a 90:10 weight ratio of PVDF-TrFE-CFE:

Polymer2 according to some embodiments of the disclosure. Neat PVDF-TrFE-CFE shows a single transition at 125° C., while two melting transitions are observed in Examples 5 and 7. There is a significant improvement of crystallinity at these compositions. On the other hand, the melting transition of PVDF-TrFE-CFE remains almost intact in the blend containing PPO (such as Example 8) while only broadening is observed.

Figure 3:
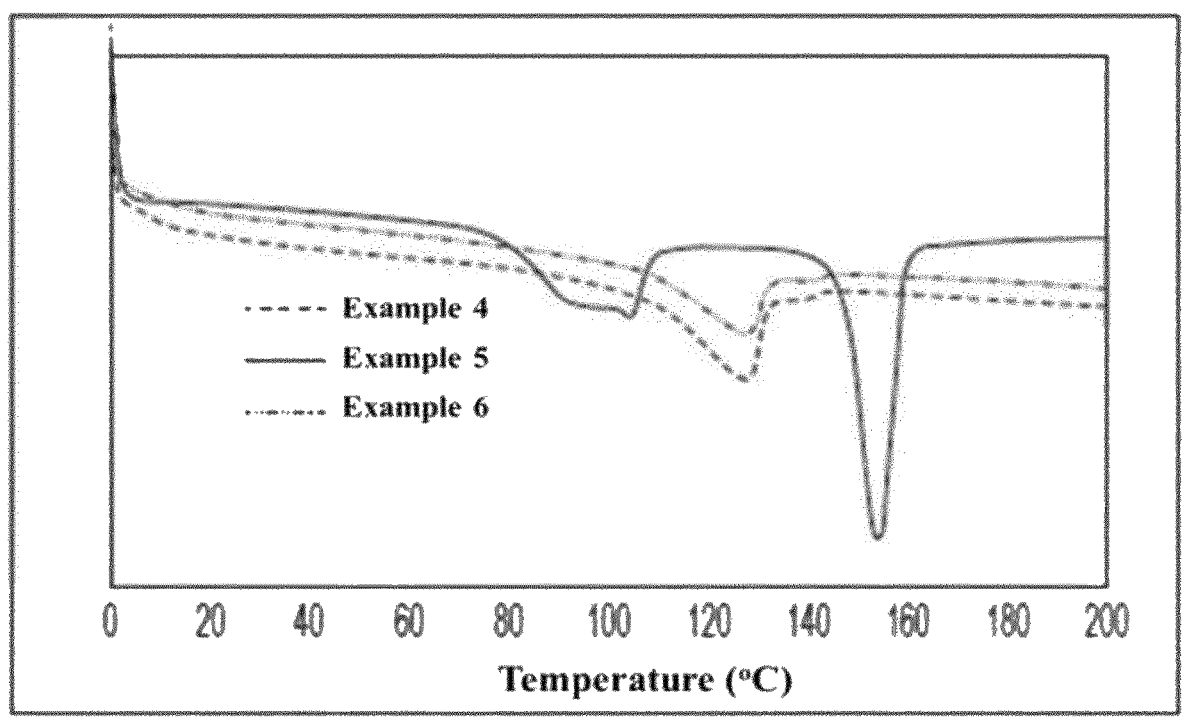
FIG. 3 shows DSC thermograms of piezoelectric polymer blends with varying weight ratios of PVDF-TrFE-CFE:ASA according to some embodiments of the disclosure.

FIG. 3 shows DSC thermograms of piezoelectric polymer blends with varying weight ratios of PVDF-TrFE-CFE:ASA according to some embodiments of the disclosure. FIG. 3 shows the effect of PVDF-TrFE-CFE/ASA blend ratio on the transition temperature. A shift in the melting transitions is evident at a 90/10 PVDF-TRFE-CFE/ASA blend, while in 95/5 and 80/20 blends there is approximately no change in the transition temperature.

Figure 4:
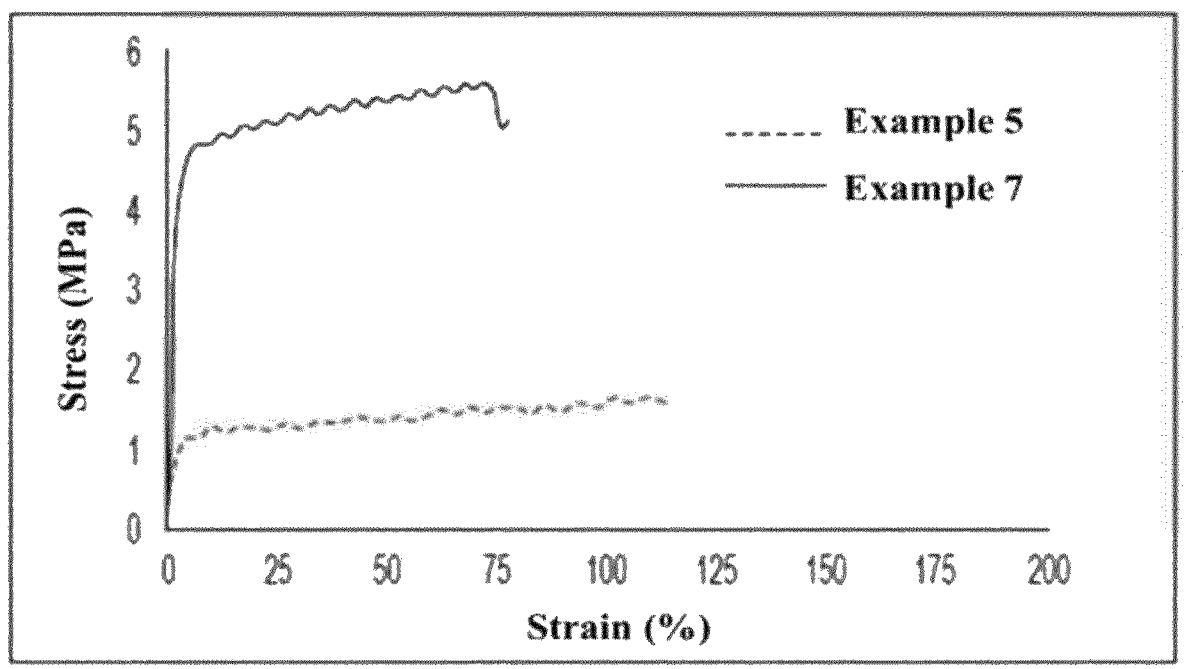
FIG. 4 shows graphs for stress-strain measurements of piezoelectric polymer blends having a 90:10 weight ratio of PVDF-TrFE-CFE:Polymer2 according to some embodiments of the disclosure.

FIG. 4 shows graphs for stress-strain measurements of piezoelectric polymer blends having a 90:10 weight ratio of PVDF-TrFE-CFE:Polymer2 according to some embodiments of the disclosure. The modulus of Example 7 is higher than Example 5.

The shift of melting transitions and improvement of crystallinity in PVDF-TrFE-CFE/acrylate polymer blends at 90/10 blend ratio indicates excellent compatibility between the two components of the blends. The induced crystallization increases piezoelectricity in the blend composition. The increased crystallinity and the high modulus of PMMA led to an improvement in modulus of PVDF-TrFE-CFE/PMMA blend. Comparison of Examples 1, 2, and 3 shows that the presence of acrylate polymer as third component lowers $d_{33}$ slightly, however it leads to improvement in modulus, specifically with PMMA (Table 1), which is due to the induced crystallization in PVDF-TrFE-CFE by acrylate polymers.

Although embodiments of the present application and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the above disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

We claim:

1. A polymer composite, comprising:
a polymer matrix comprising at least two polymers: a first non-piezoelectric polymer comprising poly(vinylidene fluoride-trifluoroethylene-chlorofluoroethylene) (PVDF-TrFE-CFE), and a second non-piezoelectric polymer comprising polymethyl methacrylate or acrylonitrile-styrene-acrylate of 5-15 wt % of the at least two polymers;
wherein the polymer matrix exhibits piezoelectric properties independent of a piezoelectric filler.

2. The polymer composite of claim 1, wherein the polymer composite further comprises a piezoelectric ceramic filler embedded in the polymer matrix, the piezoelectric ceramic filler comprising lithium doped potassium sodium niobate (KNLN).

3. The polymer composite of claim 1, in which the second non-piezoelectric polymer is compatible with the first non-piezoelectric polymer.

4. The polymer composite of claim 1, in which the at least two polymers comprise approximately ten percent by weight or more of the second non-piezoelectric polymer.

5. The polymer composite of claim 1, in which the second non-piezoelectric polymer has a dielectric constant of less than approximately 20.

6. The polymer composite of claim 1, further comprising a flexible substrate attached to the polymer composite, and in which the polymer composite is a mechanically-flexible thin film.

7. The polymer composite of claim 1, wherein the polymer composite has a thickness between 50 and 200 microns.

8. The polymer composite of claim 1, in which the polymer composite is characterized by a piezoelectric strain constant of between approximately 30 and approximately 70 pC/N, and by a piezoelectric voltage constant between approximately 100 and approximately 300 mV-m/N.

9. A method of manufacturing a thin film using the polymer composite as claimed in claim 1.

10. The method of claim 9, in which the method comprises:
dissolving the first polymer into a solution of the second polymer in a solvent to form a two-polymer solution, wherein the solvent is characterized by a dielectric constant of at least 20 and a boiling point of at least 80 degrees C.;
adding the piezoelectric ceramic filler to the two-polymer solution to form a dispersion or suspension;
forming the polymer composite thin film by casting and drying the solvent; and
subjecting the polymer composite to an electric polarization.

11. The method of claim 10, in which dissolving the first polymer into the solution of the second polymer produces a two-polymer solution comprising 5 to 20 wt./vol % of polymer.

12. The method of claim 11, further comprising annealing the polymer composite in an inert atmosphere.

13. A piezoelectric sensor comprising the polymer composite claim 1, in which the piezoelectric sensor is configured to generate an analog signal proportional to an amount of deflection applied to the piezoelectric sensor by a user, in which the piezoelectric sensor is integrated in a mobile device.

14. The polymer composite of claim 2, wherein
the piezoelectric ceramic filler is present in an amount of approximately 40-70% by volume of the polymer composite.

15. The polymer composite of claim 14, wherein the second non-piezoelectric polymer comprises polymethyl methacrylate or acrylonitrile-styrene-acrylate of 8-12 wt % of the at least two polymers.

16. The polymer composite of claim 14, wherein the second non-piezoelectric polymer comprises polymethyl methacrylate or acrylonitrile-styrene-acrylate of 10 wt % of the at least two polymers.

17. A polymer composite, comprising:
a polymer matrix comprising at least two polymers: a first non-piezoelectric polymer comprising poly(vinylidene fluoride-trifluoroethylene-chlorofluoroethylene) (PVDF-TrFE-CFE), and a second non-piezoelectric polymer comprising 5-15 wt % of polymethyl methacrylate or acrylonitrile-styrene-acrylate;
wherein the polymer matrix exhibits at least two melting transitions.

18. The polymer composite of claim 1, wherein the second non-piezoelectric polymer comprises 5-10 wt % of the at least two polymers.

* * * * *